United States Patent [19]

Mutsaers et al.

[11] Patent Number: 5,399,235
[45] Date of Patent: Mar. 21, 1995

[54] METHOD OF MANUFACTURING A SEMICONDUCTOR DEVICE IN WHICH A SURFACE OF A SEMICONDUCTOR BODY IS PROVIDED WITH MUTUALLY-INSULATED ALUMINUM TRACKS

[75] Inventors: Cornelis A.H.A. Mutsaers; Robertus A.M. Wolters, both of Eindhoven, Netherlands

[73] Assignee: U.S. Philips Corporation, New York, N.Y.

[21] Appl. No.: 197,372

[22] Filed: Feb. 14, 1994

Related U.S. Application Data

[63] Continuation of Ser. No. 977,957, Nov. 18, 1992, abandoned.

[30] Foreign Application Priority Data

Nov. 19, 1991 [EP] European Pat. Off. ............ 91203001

[51] Int. Cl.$^6$ ............................................. H01L 21/306
[52] U.S. Cl. ..................................... 156/636; 437/190; 437/194; 437/195
[58] Field of Search ................. 156/636; 437/190, 194, 437/195

[56] References Cited

U.S. PATENT DOCUMENTS

| | | |
|---|---|---|
| 4,116,714 | 9/1978 | Basi . |
| 4,767,724 | 8/1988 | Kim et al. ............................ 437/194 |
| 4,789,648 | 12/1988 | Chow et al. ......................... 437/228 |
| 4,839,311 | 6/1989 | Riley et al. .......................... 437/241 |
| 4,954,423 | 9/1990 | McMann et al. ................... 437/190 |
| 5,001,079 | 3/1991 | Van Laarhoven et al. ......... 437/194 |
| 5,169,491 | 12/1992 | Doan .................................... 156/636 |
| 5,187,121 | 2/1993 | Cote et al. .......................... 437/190 |
| 5,302,551 | 4/1994 | Iranmanesh et al. ............... 437/194 |

FOREIGN PATENT DOCUMENTS 0334646 6/1987 European Pat. Off. .
0241729 10/1987 European Pat. Off. .

OTHER PUBLICATIONS

J. Saraie et al., "High Quality Al$_2$O$_3$ Thin Films Prepared by a Novel Two-Step Evaporation Process," *J. Electrochem. Soc.*, Nov. 1987, pp. 2805–289.

Primary Examiner—Brian E. Hearn
Assistant Examiner—Trung Dang
Attorney, Agent, or Firm—Steven R. Biren

[57] ABSTRACT

A method of manufacturing a semiconductor device whereby on a surface (1) of a semiconductor body (2) a layer comprising aluminum (3) is deposited, in which conductor tracks (4) are etched, between which then an insulating aluminum compound (6) is provided in that a layer of such a material (7) is deposited, which layer is then removed down to the conductor tracks (4) by a bulk reducing treatment, upon which an insulating layer (11) is deposited into which contact windows (13, 14) are etched down to the layer comprising aluminum (4) for local contacting of the conductor tracks (4). The conductor tracks (4) are provided with a top layer (8) before the deposition of the insulating aluminum compound, and the aluminum compound is removed again down to the top layer (8) after the deposition by means of a polishing treatment which is practically incapable of removing the top layer (8). Mutually insulated conductor tracks (4) can be made in this manner which are suitable for use in integrated circuits with a very high integration density (VLSI).

6 Claims, 1 Drawing Sheet

METHOD OF MANUFACTURING A SEMICONDUCTOR DEVICE IN WHICH A SURFACE OF A SEMICONDUCTOR BODY IS PROVIDED WITH MUTUALLY-INSULATED ALUMINUM TRACKS

This is a continuation of application Ser. No. 07/977,957, filed Nov. 18, 1992, now abandoned.

Method of manufacturing a semiconductor device in which a surface of a semiconductor body is provided with mutually-insulated aluminium tracks.

BACKGROUND OF THE INVENTION

The invention relates to a method of manufacturing a semiconductor device whereby a layer comprising aluminium is deposited on a surface of a semiconductor body, into which layer conductor tracks are etched, between which tracks an insulating aluminium compound is provided by a layer of such a material being deposited and subsequently removed by a bulk reducing treatment down to the conductor tracks, after which a layer of insulating material is deposited in which contact windows are etched down to the layer comprising aluminium for local contacting of the conductor tracks.

A plane metallization structure of aluminium conductor tracks which are mutually insulated in the lateral direction by an insulating aluminium compound, such as aluminium oxide or aluminium nitride, is realized by such a method on the surface of the semiconductor body. Such plane metallization structures have long been made by a layer of aluminium being deposited on a stirface of a semiconductor body and is then locally converted into aluminium oxide by means of an anodizing process in, for example, oxalic acid. Such a wet anodizing process does not take place fully anisotropically, so that the oxidation of the aluminium layer in the lateral direction proceeds almost as fast as the oxidation in the thickness direction. As a result, no conductor tracks could be made in this manner suitable for use in integrated circuits with a very high integration density (VLSI). In the method mentioned above, the conductor tracks are etched and the spaces between the conductors are subsequently filled with an insulating aluminium compound. In this manner it is indeed possible to make plane metallization structures which are suitable for such integrated circuits.

The layer comprising aluminium may be a layer of pure aluminium, but may alternatively be a layer of aluminium to which a small quantity of another element or even of several other elements has been added to improve its properties. Usual additives are, for example, a few % by weight of silicon to prevent silicon from a silicon substrate dissolving in the layer comprising aluminium, and a few % by weight of copper to suppress electromigration effects in the layer. These additives, however, render the anodizing oxidation process mentioned above difficult. Copper, for example, is dissolved in oxalic acid so that an undesirable porous layer of aluminium oxide is formed.

U.S. Pat. No. 4,767,724 discloses a method of the kind mentioned in the opening paragraph whereby a deposited layer of aluminium oxide is first planarized, so that the layer has a plane surface which runs substantially parallel to the surface of the semiconductor body. Then the layer is etched away down to the conductor tracks. A metallization structure is thus obtained with a plane surface. A comparatively thin layer of aluminium oxide and a comparatively thick layer of silicon oxide are then deposited on this surface. The comparatively thin layer of aluminium oxide serves as an etching stopper during etching of the contact windows into the layer of silicon oxide. After etching of the contact windows into the layer of silicon oxide, the thin layer of aluminium oxide inside the windows is etched away.

Although conductor tracks suitable for use in integrated circuits with a very high integration density (VLSI) can be made by the known method, this known method also has some disadvantages. Thus planarizing and subsequent etching away of the planarized layer of aluminium oxide down to the aluminium conductor tracks is a process which is difficult to control. Aluminium oxide is etched in a plasma containing boron chloride. At the end of the etching process, when the aluminium oxide has just been removed from the aluminium tracks, these tracks will also be etched in such a plasma. Since such an etching process does not take place equally fast everywhere, seen over the entire surface of the semiconductor body, the conductor pattern may become strongly etched locally to an undesirable extent. A similar problem occurs once more when the comparatively thin layer of aluminium oxide which serves as an etching stopper and which is still present inside the contact windows after etching of the layer of silicon oxide, is to be etched away.

SUMMARY OF THE INVENTION

The invention has for its object to counteract the above-mentioned disadvantages. According to the invention, the method of the kind mentioned in the opening paragraph is for this purpose characterized in that the conductor tracks are provided with a top layer before the deposition of the layer of the insulating aluminium compound, and in that after said deposition the insulating aluminium compound is removed down to the said top layer by means of a polishing treatment by which material of the top layer is substantially not removed.

Unevennesses in a surface are eliminated by means of a polishing treatment. Therefore, it is not necessary first to planarize the layer of the insulating aluminium compound which is taken off by means of the polishing treatment. Since the material of the top layer is substantially not removed by the polishing treatment, the bulk reducing action stops automatically when the top layer is reached. The insulating aluminium compound present between the conductor tracks is then protected by the conductor tracks. A structure having a substantially plane surface results, bounded by the conductor tracks provided with their top layer and the aluminium compound situated between the conductor tracks next to one another.

The layer of insulating material, such as silicon oxide, silicon nitride, or silicon oxinitride, is deposited on this plane structure, and contact windows are then etched therein. Usual etching processes which are used for etching such holes are generally automatically stopped on aluminium and aluminium compounds. It is not necessary, accordingly, to provide an extra etching stopper layer below the layer of silicon oxide when the method according to the invention is used.

It is possible for the top layer to be provided after the conductors have been formed in the layer comprising aluminium. Preferably, however, the layer comprising aluminium is provided with the top layer before the conductor tracks are formed therein, and the conductor tracks are formed both in the layer comprising aluminium and in the top layer. The pattern of conductor tracks is accordingly first formed in the top layer and then in the layer comprising aluminium. The pattern provided in the top layer may then be used as an etching mask for patterning the layer comprising aluminium. The layer comprising aluminium as a result may be etched into a pattern by means of a mask which contains no organic components. An undesirable polymer formation on the layer comprising aluminium is avoided in this way.

Preferably, furthermore, a top layer is deposited which consists of the same material as the insulating layer which is deposited on the conductor tracks, such as silicon oxide. The top layer of the aluminium conductor tracks is then also automatically etched away at the areas of the contact windows during etching of the contact windows in the upper layer of insulating material in that case.

To serve as the etching mask mentioned above, a top layer of silicon oxide having a thickness of 10 to 100 nm is preferably deposited.

A top layer of silicon oxide is substantially not taken off during the polishing treatment if the polishing treatment is carded out with a slurry comprising a silicon oxide powder which is brought to a pH value of 3 to 5 by means of an acid, such as phosphoric acid.

BRIEF DESCRIPTION OF THE DRAWING

The invention will be explained in more detail below by way of example with reference to the drawing, in which.

DESCRIPTION OF THE PREFERRED EMBODIMENTS

Figure 1:
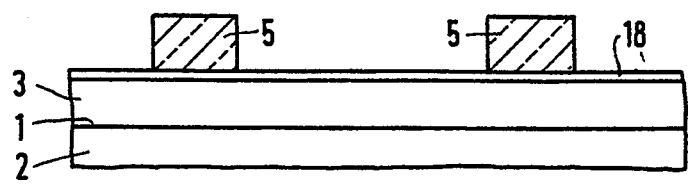
FIGS. 1 to 6 diagrammatically and in cross-section show several stages in the manufacture of the semiconductor device made by means of the method according to the invention.
Figure 2:
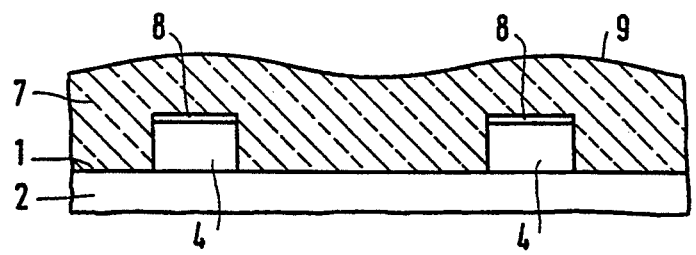
Figure 3:
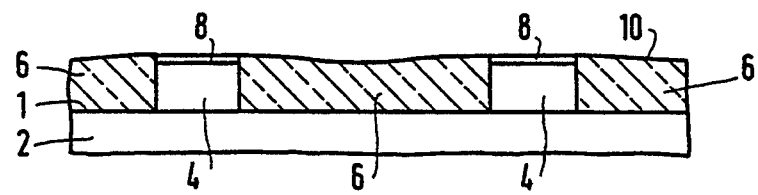
Figure 4:
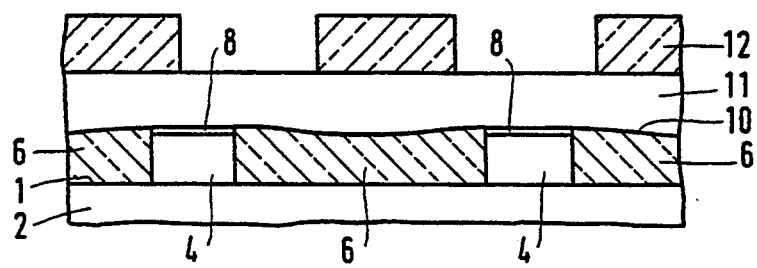

The Figures show, diagrammatically and in cross-section, several stages in the manufacture of a semiconductor device, a layer 3 comprising aluminium being deposited on a surface 1 of a semiconductor body 2, into which layer conductor tracks 4 are etched. For this purpose, the layer is provided with a photoresist mask 5 in usual manner, after which the layer 3 is etched in a usual plasma containing chlorine.

The layer 3 comprising aluminium may be a layer of pure aluminium, but alternatively a layer of aluminium to which a small quantity of another element or even some other elements has been added to improve its properties. Usual are, for example, additives of a few % by weight of silicon to prevent silicon from a silicon substrate dissolving in the layer comprising aluminium, and of a few % by weight of copper to suppress electromigration effects in the layer.

An insulating aluminium compound 6, such as aluminium oxide or aluminium nitride, is then provided between the conductor tracks 4 in that a layer 7 of this material is deposited, for example, by means of a usual CVD (chemical vapor deposition) or sputtering deposition process, and is removed down to the conductor tracks 4 by a bulk reducing treatment. A plane metallization structure of aluminium conductor tracks 4 which are mutually insulated in the lateral direction by an insulating aluminium compound 6 is thus realized on the surface 1 of the semiconductor body 2. Such plane metallization structures have long been made in that a layer of aluminium is deposited on a surface of a semiconductor body and this layer is then locally convened into aluminium oxide by means of an anodizing process in, for example, oxalic acid. Such a wet anodizing process does not take place fully anisotropically, so that the oxidation of the aluminium layer in the lateral direction proceeds almost as fast as that in the thickness direction. Therefore, no conductor tracks suitable for use in integrated circuits with a very high integration density (VLSI) could be made by this method. By the method mentioned above, whereby the conductor tracks are etched and the spaces between the conductors are then filled with the insulating aluminium compound, it is indeed possible to make plane metallization structures which are suitable for such integrated circuits.

According to the invention, the conductor tracks 4 are provided with a top layer 8 before the deposition of the layer of the insulating aluminium compound 7, while after the deposition the layer 7 is removed down to the top layer 8 by means of a polishing treatment with which the top layer 8 can substantially not be removed. Unevennesses in the surface 9 are eliminated by a polishing treatment. It is not necessary, therefore, to planarize the layer 7 before the aluminium compound is taken off by the polishing treatment. Since the material of the top layer 8 is substantially not taken off by the polishing treatment, the material reduction stops automatically the moment the top layer 8 is reached. The insulating aluminium compound 6 present between the conductor tracks 4 is then protected by these conductor tracks. A structure is created with a substantially plane surface 10 bounded by the conductor tracks 4 provided with their top layer 8 and the aluminium compound 6 situated between the conductor tracks next to one another.

On this plane structure, an insulating layer 11 of, for example, silicon oxide, silicon nitride, or silicon oxinitride is deposited, on which a photoresist mask 12 is provided, after which contact windows 13, 14 are etched into the layer 11. Usual etching processes for making such contact holes are generally automatically stopped at aluminium and aluminium compounds. It is not necessary, therefore, to provide an extra etching stopper layer below the layer of silicon oxide when the method according to the invention is used.

Figure 5:
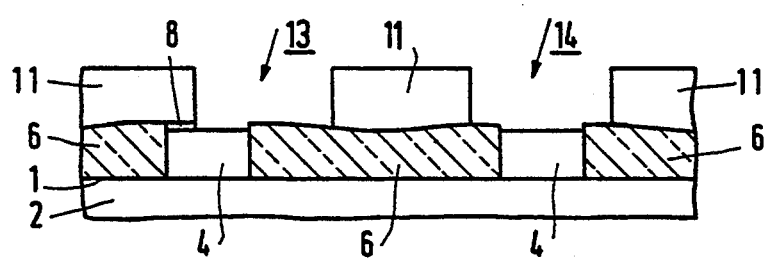
Figure 6:
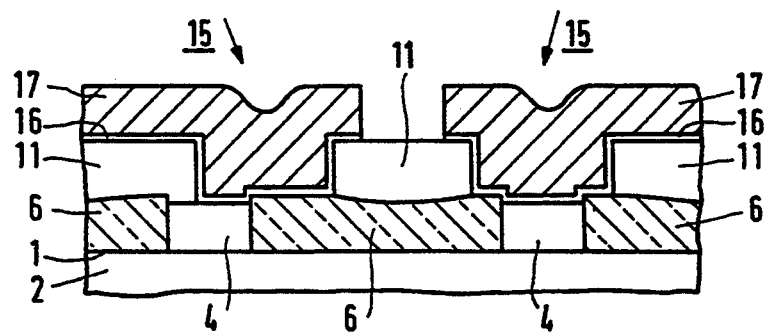

FIG. 5 shows two kinds of contact holes. The contact hole 13 on the left overlaps the conductor track 4 and the insulating layer 6; a portion of the top layer 8 is still present below the layer of silicon oxide 11. The contact hole 14 on the right overlaps the layer 6 on either side of the conductor track 4; the top layer 8 has been entirely removed from this conductor track.

The conductor track 4 may now be locally contacted through the contact windows 13, 14 by means of a second pattern of conductor tracks 15 provided on the insulating layer 11. This pattern is provided, for example, in usual manner in a barrier layer 16 of a titanium-tungsten alloy and an aluminium layer 17.

The top layer 8 cannot be provided until after the conductors 4 have been formed in the layer comprising aluminium. Preferably, however, the layer 3 comprising aluminium is provided with a layer 18 of the material from which the top layer 8 is formed before the conductor tracks 4 are formed therein, and the conductor tracks 4 are formed both in the layer 3 comprising aluminium and in this layer 18. So the pattern of conductor tracks 4 is first formed in the layer 18 and afterwards in the layer 3 comprising aluminium. The pattern provided in the layer 18 may then be used as an etching mask for patterning the layer 3 comprising aluminium. The layer comprising aluminium can accordingly be etched into a pattern by means of a mask which contains no organic components. Undesirable polymer formation on the layer comprising aluminium is avoided in this way.

Furthermore, a layer 18 is preferably deposited consisting of the same material as the insulating layer 11 which is deposited on the conductor tracks 4. Both layers 18 and 11 are made, for example, of silicon oxide. During etching of the contact windows 13, 14 into the upper layer 11, the top layer 8 of the aluminium conductor tracks 4 is then also automatically etched away at the areas of the contact windows 13, 14.

A top layer 8 of silicon oxide having a thickness of 10 to 100 nm is preferably deposited so as to serve as the etching mask mentioned above.

A top layer 8 of silicon oxide is substantially not taken off during the polishing treatment if this polishing treatment is carried out with a slurry containing a silicon oxide powder and brought to a pH of 3 to 4 by means of an acid, such as phosphoric acid.

We claim:

1. A method of manufacturing a semiconductor device whereby a layer comprising aluminium is deposited on a surface of a semiconductor body, into which layer conductor tracks are etched, between which tracks an insulating aluminium compound is provided by a layer of such a material being deposited and subsequently removed by a bulk reducing treatment down to the conductor tracks, after which a layer of insulating material is deposited in which contact windows are etched down to the layer comprising aluminium for local contacting of the conductor tracks, characterized in that the conductor tracks are provided with a top layer before the deposition of the layer of the insulating aluminium compound, in that the top layer is provided of the same material as said layer of insulating material, and in that after said deposition of the insulating aluminium compound a percentage of the insulating aluminium compound is removed to expose said top layer by a polishing treatment during which a percentage of the top layer between zero percent and a percentage less than said percentage of the insulating aluminium compound is removed.

2. A method as claimed in claim 1, characterized in that the layer comprising aluminium is provided with the top layer before the conductor tracks are formed therein, and the conductor tracks are formed both in the layer comprising aluminium and in the top layer.

3. A method as claimed in claim 1, characterized in that the top layer comprises silicon oxide.

4. A method as claimed in claim 3, characterized in that the top layer of silicon oxide has a thickness of 10 to 100 nm.

5. A method as claimed in claim 1, characterized in that the polishing treatment is carried out with a slurry comprising a silicon oxide powder which is brought to a pH value of 3 to 5 by means of an acid.

6. A method as claimed in claim 5, characterized in that the acid with which the slurry is brought to the desired pH value is phosphoric acid.

* * * * *